United States Patent [19]

Hein et al.

[11] 4,179,531

[45] Dec. 18, 1979

[54] POLYTHIOL EFFECT, CURABLE MONOALKENYL AROMATIC-DIENE AND ENE COMPOSITION

[75] Inventors: Paul R. Hein; Robert A. Irvin, both of Marietta, Ga.

[73] Assignee: W. R. Grace & Co., Cambridge, Mass.

[21] Appl. No.: 827,002

[22] Filed: Aug. 23, 1977

[51] Int. Cl.$^2$ .............................................. B05D 3/06
[52] U.S. Cl. .................................. 430/300; 427/53.1; 427/54.1; 204/159.2; 204/159.24; 430/286
[58] Field of Search ................ 260/876 B, 894; 96/35.1, 36.3, 115 P; 204/159.15, 159.19, 159.14, 159.20, 159.24; 427/44, 54, 53

[56] References Cited

U.S. PATENT DOCUMENTS

| | | | |
|---|---|---|---|
| 3,029,223 | 4/1962 | Hibbard | 260/45.5 |
| 3,051,695 | 8/1962 | Warner et al. | 260/139 |
| 3,084,115 | 4/1963 | Smith et al. | 204/154 |
| 3,144,422 | 8/1964 | Homberg | 260/23 |
| 3,149,182 | 9/1964 | Porter | 260/879 |
| 3,240,844 | 3/1966 | Gruver | 260/894 |
| 3,338,810 | 8/1967 | Warner | 204/159.18 |
| 3,615,450 | 10/1971 | Werber et al. | 96/35.1 |
| 3,627,529 | 12/1971 | Frank et al. | 96/33 |
| 3,640,923 | 2/1972 | Guthrie | 204/159.24 |
| 3,661,744 | 5/1972 | Kehr | 204/159.14 |
| 3,666,461 | 5/1972 | Kehr et al. | 96/35.1 |
| 3,674,486 | 7/1972 | Milgrom | 96/35.1 |
| 3,716,466 | 2/1973 | Hook | 204/159.17 |
| 3,783,152 | 1/1974 | Larsen | 260/471 C |
| 3,832,421 | 8/1974 | Morgan | 260/859 |
| 3,843,502 | 10/1974 | Pearson et al. | 204/159.18 |
| 3,843,572 | 10/1974 | Morgan | 260/17 |
| 3,864,229 | 2/1975 | Zapp et al. | 204/159.15 |
| 3,950,281 | 4/1976 | Usamoto et al. | 260/4 R |
| 4,008,341 | 2/1977 | Kehr | 427/44 |
| 4,045,231 | 8/1977 | Toda et al. | 96/115 P |

FOREIGN PATENT DOCUMENTS

| | | |
|---|---|---|
| 885388 | 11/1971 | Canada . |
| 924047 | 4/1973 | Canada . |
| 926183 | 5/1973 | Canada . |
| 930094 | 7/1973 | Canada . |
| 2456439 | 8/1976 | Fed. Rep. of Germany . |
| 2610206 | 9/1976 | Fed. Rep. of Germany . |
| 1312492 | 4/1973 | United Kingdom . |
| 1350260 | 4/1974 | United Kingdom . |
| 1366769 | 9/1974 | United Kingdom . |
| 1379229 | 1/1975 | United Kingdom . |
| 1395822 | 5/1975 | United Kingdom . |
| 1420351 | 1/1976 | United Kingdom . |

OTHER PUBLICATIONS

Kuntz, "J. Poly. Sci.", 54(1961), 569–586.
Spirin, et al., "J. Poly. Sci.", 58(1962) 1181–1189.

*Primary Examiner*—John H. Newsome
*Attorney, Agent, or Firm*—Edward J. Hanson, Jr; C. Edward Parker

[57] ABSTRACT

Curable composition containing (1) at least 20% by weight monoalkenyl aromatic-diene copolymer resin; (2) at least 2% by resin weight of at least one monomer substantially compatible with said resin and having at least one cross-linkable C—C-double bond; (3) 0.1 to 35% by resin weight of polythiol containing at least two-SH groups per molecule; and, (4) a curing agent. The disclosure is directed primarily at printing plate production and the composition contains 0.01 to 10% by resin weight of photoinitiator and the monomer is an addition photopolymerizable polyethylenically unsaturated acrylic or methacrylic acid ester containing two or more acrylate or methacrylate groups per molecule or mixtures thereof. In an alternate form low molecular weight liquid rubber polymer may be included in the compositon. Other materials such as stabilizers may also be present.

14 Claims, No Drawings

POLYTHIOL EFFECT, CURABLE MONOALKENYL AROMATIC-DIENE AND ENE COMPOSITION

BACKGROUND OF THE INVENTION

This invention relates to a curable composition and especially to those that can have controlled cure through the use of appropriate curing agents. In its most preferred and presently useful form the invention provides relief printing plates which are characterized by unusually rapid photochemical cure rates, improved solvent resistance and non-tacky surfaces while retaining the many desirable properties espoused for other plates and often with enhanced quality.

Many patents independently reveal various features of the inventive composition. They however lack the overall advantage presented by the synegistic activity of the present new composition. British Pat. No. 1,395,822 discloses a composition having an A-B-A type block copolymer present in an amount of at least 40% by weight, at least 5% by weight of an addition photopolymerizable polyethylenically unsaturated acrylic or methacrylic acid ester containing two or more acrylate or methacrylate groups per molecule and 0.1 to 10% by weight of an addition polymerizable initiator activatable by actinic light. As a preferred embodiment the British Pat. No. 1,395,822, discloses a composition having 60-85 parts by weight of the block copolymer, 40-75 parts by weight of ethylene glycol diacrylate or methacrylate, trimethylolpropane triacrylate or methacrylate or pentaerythritol tetraacrylate or methacrylate and from 1.5 to 4.0 parts by weight of benzophenone. An optional identified ingredient is liquid rubber polymer having a molecular weight between 750 and 3000, in a preferred embodiment 5-30 parts by weight of liquid polybutadiene.

Another patent showing an A-B-A block copolymer composition is U.S. Pat. No. 3,674,486. This is represented by control Example XIII of the present application. Yet another A-B-A block copolymer composition is disclosed in British 1,366,769. A-B block copolymer compositions are disclosed in German Patent Publications DT OS No. 24 56 439 and DT OS No. 26 10 206.

As is illustrated in Table 1 of the present application the compositions of the above references are less rapid in curing than the compositions of the present invention. This is also illustrated by Example I-VI as contrasted with Control Examples VII-XII which also illustrate that the composition of the present invention produces printing plates that are not tacky while printing plates produced from the composition of the above references are tacky.

There are a number of U.S. and foreign patents that show photocurable compositions that have as a major chemically functioning constituent a polythiol. This is unlike the present invention where the polythiol constituent seemingly acts in some way to regulate and make more effective the polymerization of the other constituent components of the composition. The curable compositions of the present invention, as a general rule cure within minutes without the presence of the polythiol. Examples of patents that show photocurable compositions that have a polythiol as a major chemically functioning constituent are U.S. Pat. Nos. 4,008,341; 3,843,572; 3,832,421; 3,783,152; 3,666,461; 3,661,744; 3,627,529 and 3,615,450 and Canadian Pat. Nos. 930,094; 926,183; 924,047 and 885,388.

SUMMARY OF THE INVENTION

The compositions, radiation cured structures and photo cured printing plate forming methods of the present invention provide rapid cure, improved solvent resistance and essentially non-tacky surfaces. An essential element in carrying out the invention is a composition having the following essential characteristics:

(1) at least about 20%, more preferably at least 40%, by weight of the composition is monoalkenyl aromatic-diene copolymer resin;

(2) at least about 2%, more preferably at least 10%, by resin weight of at least one monomer substantially compatible with said resin and having at least one cross-linkable C—C-double bond; and (3) about 0.1 to about 35%, more preferably 0.5 to 10%, by resin weight of polythiol containing at least two-SH groups per molecule.

DESCRIPTION OF THE PREFERRED EMBODIMENT

The present invention in its preferred embodiment is a method for forming a printing plate which involves exposing to actinic radiation projected through an image-bearing transparency selected portions of a radiation curable composition having the following characteristics:

(1) at least 20% by weight of said composition of monoalkenyl aromatic-diene copolymer resin;

(2) at least 2% by resin weight of at least one monomer substantially compatible with said resin and having at least one photo-cross-linkable C—C-double bond;

(3) 0.1 to 35% by resin weight of polythiol containing at least two-SH groups per molecule; and (4) 0.01 to 10% by resin weight of photoinitiator.

For better printing plate products the monoalkenyl aromatic-diene copolymer resin is present in the composition in an amount of at least 40% by weight. The preferred monoalkenyl aromatic-diene copolymer resin is the type having the general formula: A-B-A wherein the end blocks A are monoalkenyl aromatic polymer blocks which may be the same or different and which have an average molecular weight of from 2,000 to 100,000 and a glass transition temperature above 25° C., the total block A content being 10-50% by weight of the copolymer, and B is an elastomeric diene polymer block having an average molecular weight of from 25,000 to 1,000,000 and a glass transition temperature below 10° C.

These end blocks (A) are typically derived from monoalkenyl aromatic compounds having the general formula:

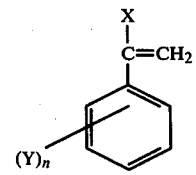

wherein X represents hydrogen or an alkyl radical containing 1 or 2 carbon atoms such as a methyl or ethyl radical; Y represents hydrogen or an alkyl radical containing from 1 to 4 carbon atoms such as a methyl, ethyl, n-propyl, isopropyl, n-butyl, sec-butyl or a tert-butyl radical; and n represents an integer from 1 to 5. Examples of the alkenyl aromatic compounds which are within the scope of formula A are: styrene, alphamethyl styrene, tert-butyl styrene, vinyl toluene, ortho- and para-methyl styrenes, ortho- and para-methyl-alpha-methyl styrenes, and ortho- and para-ethyl styrenes.

The elastomeric block (B) is preferably a diene polymer block derived from a conjugated diene hydrocarbon compound having the general formula:

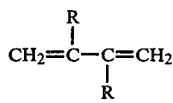

wherein each R individually represents hydrogen or an alkyl radical containing 1 or 2 carbon atoms such as a methyl or ethyl radical. Examples of the conjugated diene hydrocarbon compounds which are within the scope of block B are 1,3-butadiene and 2-methyl-1,3-butadiene.

Typical examples of the just described monoalkenyl aromatic-diene block copolymers, useful in the present invention, are described in U.S. Pat. No. 3,265,765, the contents of which are incorporated herein by reference.

An alternate but in general less desirable monoalkenyl aromaticdiene copolymer resin—for use in the present invention—is of the type having the general formula:

A—B wherein blocks A and B are the same as those designated by the same letters in the A-B-A block copolymer. The A-B type copolymer resin can have a sharp or a blurred, i.e. a "flowing" transition between the two block segments of the copolymer formed solely from diene-hydrocarbons or styrene-monomers. The two-block-copolymers contain 5 to 70 and preferably 10 to 40% by weight in units of the last mentioned monomer of the styrene type, and consequently 30 to 95 and preferably 60 to 90% by weight of polymerized-end units of diene-hydrocarbon. The production of the two-block copolymers of the above-mentioned type is known per se and can in particular take place according to the procedure described in U.S. Pat. No. 3,149,182. Reference is also made to the articles by I. Kuntz, J. Polymer Sci. 54 (1961), 569–586 and Y. U. Spirin, et al., J. Polymer Sci. 58 (1962) 1181–1189. The copolymers can be produced continuously or discontinuously. In the production of copolymers with sharply separated block segments through stepwise copolymerization, it is advantageous to start with the polymerization of the monomer which quantitatively preponderates. Advantageously, the two-block copolymers are produced by solution-polymerization whereby suitable solvents are in particular hydrocarbons or mixtures thereof as well as polar solvents such as tetrahydrofurane. The type of solvent influences the fine structure of the two-block copolymer like the configuration of the diene-polymer segments. Preferably hydrocarbons are used as solvents. It is particularly advantageous to use the solutions of the block copolymers produced by solution-polymerization either directly or in concentrated state, after adding the other coating constituents for producing the photo-cross-linkable layer by casting.

Suitable two-block copolymers of the indicated type, measured as 0.5% by weight solutions in toluene, have viscosity numbers of approximately 60 to 350 ml/g and in particular 90 to 250 ml/g, corresponding to a molecular weight range $\overline{M}_\nu$ of approximately 75,000 to 200,000.

It is naturally also possible to use mixtures of the copolymer resins of the indicated types or for special applications to mix the two-block copolymers with small quantities of other compatible polymers and particularly elastomers.

For better printing plate products the monomer that is substantially compatible with the resin and has at least one cross-linkable C—C-double bond is present in an amount of at least 10% by resin weight. Preferably the monomer is present in an amount of 15–30% by resin weight. For better printing plate products the monomer is preferably an addition photopolymerizable polyethylenically unsaturated acrylic or methacrylic acid ester containing two or more acrylate or methacrylate groups per molecule or mixtures thereof. A few illustrative examples of such multifunctional acrylates are ethylene glycol diacrylate, ethylene glycol dimethacrylate, trimethylolpropane triacrylate, trimethylolpropane trimethacrylate, pentaerythritol tetra-acrylate or pentaerythritol-tetramethacrylate, hexane-diol-1,6-dimethacrylate, and diethylene-glycol-dimethacrylate.

Also useful in some special instances are mono acrylates such as n-butyl-acrylate, n-butyl-methacrylate, 2-ethylhexyl-acrylate, lauryl-acrylate, and 2-hydroxypropyl-acrylate. Small quantities of amides of (meth)acrylic acid such as N-methylol-methacrylamide-butyl-ether are also suitable. N-vinyl-compounds such as N-vinyl-pyrrolidone, vinyl-esters of aliphatic monocarboxylic acids such as vinyl-oleate, vinyl-ethers of diols such as butane-diol-1,4-divinyl-ether and allyl-ether and allyl-ester are also suitable. Isocyanate-free reaction products of organic polyisocyanates such as hexamethylene-diisocyanate, isophorone-diisocyanate or tolylene-diisocyanate with hydroxyl group-containing (meth)acrylates such as glycol-monoacrylate, hydroxypropyl-methacrylate or 1,4-butane-diol-monoacrylate are also suitable as monomers provided they are adequately compatible with the resin. The same applies regarding the reaction products of di- or polyepoxides such as butane-diol-1,4-diglycidyl-ether or bisphenol-A-diglycidyl-ether with (meth)acrylic acid. The characteristics of the photo-polymerizable layers can be modified for the specific purpose by a suitable selection of monomers or mixtures thereof.

The polythiols of the present invention are simple or complex organic compounds having a multiplicity of pendant or terminally positioned-SH functional groups per average molecule. The polythiols must contain 2 or more-SH groups/molecule. They usually have a viscosity range of slightly above 0 to about 20 million centipoises (cps) at 70° C., as measured by a Brookfield Viscometer. Included in the term "polythiols" as used herein are those materials which in the presence of reactive plasticizers such as diallyl phthalate fall within the viscosity range set out above at 70° C. Operable polythiols in the instant invention usually have molecular weights in the range about 94 to about 20,000 or more, preferably about 100 to about 10,000.

The polythiols operable in the instant invention can be exemplified by the general formula: $R_8$—$(-SH)_n$ where n is at least 2 and $R_8$ is a polyvalent organic moiety free from "reactive" carbon to carbon unsaturation. Thus, $R_8$ may contain cyclic groupings and minor amounts of hetero atoms such as N,S,P or O but, primarily, contains carbon-hydrogen, carbon-oxygen or silicone-oxygen containing chain linkages free of any "reactive" carbon to carbon unsaturation.

One class of polythiols operable in the instant invention to obtain essentially odorless cured coatings and relief images are esters of thiol containing acids of the general formula: HS—$R_9$—COOH where $R_9$ is an organic moiety containing no "reactive" carbon to carbon unsaturation with polyhydroxy compounds of the general structure: $R_{10}$—$(-OH)_n$ where $R_{10}$ is an organic moiety containing no "reactive" carbon to carbon unsaturation and n is 2 or greater. These components will react under suitable conditions to give a polythiol having the general structure:

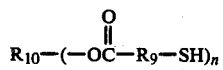

$$R_{10}-(-O\overset{O}{\overset{\|}{C}}-R_9-SH)_n$$

where $R_9$ and $R_{10}$ are organic moieties containing no "reactive" carbon to carbon unsaturation and n is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as a thiol-terminated ethylcyclohexyl dimercaptan polymer, etc. and similar polythiols which are conveniently and ordinarily synthesized on a commercial basis, although having obnoxious odors, are operable in this invention. Examples of the polythiol compounds preferred for this invention because of their relatively low odor level and fast curing rate include esters of thioglycolic acid (HS—$CH_2$—COOH), α-mercaptopropionic acid (HS—CH($CH_3$)—COOH and β-mercaptopropionic acid (HS—$CH_2CH_2$COOH) with polyhydroxy compounds such as glycols, triols, tetraols, pentaols, hexaols, etc. Specific examples of the preferred polythiols include ethylene glycol bis (thioglycolate), ethylene glycol bis (β-mercaptopropionate), trimethylolpropane tris (thioglycolate), pentaerythritol tetrakis (thiolglycolate) and the most preferred pentaerythritol tetrakis (β-mercaptopropionate) and trimethylolpropane tris (β-mercaptopropionate), and mixtures thereof all of which are commercially available.

The preferred polythiol compounds are characterized by a low level of mercaptan-like odor initially, and after reaction, give essentially odorless cured end products which are commercially useful resins or elastomers for coating and imaging end uses. For better printing plate products the amount of the polythiol of the present invention in the composition is 0.5 to 10% by resin weight.

The composition of the present invention is generally cured through the use of a curing agent which facilitates a controlled, rapid and determinable or predictable cure performance. The curing agent generally acts as a free radical generating agent. Preferably the free radical generating agent includes initiation by radiation, either UV or high energy ionizing radiation. Most preferably UV radiation is used. The composition particularly lends itself to advantage in UV curing in forming relief images and especially for printing indicia production.

Any type of actinic light from any source may be used in carrying out the UV radiation method of this invention. For the preferred photocurable composition, it is preferred that the light eminate from a point source or in the form of parallel rays but divergent beams are also operable as a source of actinic light. Practically any convenient source of high intensity light may be used. Such sources include carbon arcs, mercury arcs, fluorescent lamps with special ultraviolet light emitting phosphors, xenon arcs, sunlight, tungsten halide lamps, argon glow lamps, photographic flood lamps, laser and the like.

When UV radiation is used for curing, a photoinitiator is normally added to the composition to increase the reaction rate. Initiators or catalysts which are operative in the present invention are those which are capable of initiating photopolymerization under the influence of actinic light. The preferred catalyst or initiators are substantially soluble in the photopolymerizable composition, and are effective in promoting rapid polymerization, by which the composition is cured. Many suitable photopolymerization initiators or catalysts are listed in U.S. Pat. No. 4,008,341, the contents of which are incorporated herein by reference. The preferred photoinitiators are benzophenone and 2,2 dimethoxy 2-phenyl acetophenone. For better printing plate products the photoinitiators are added in an amount ranging from 0.2 to 5% by weight of the resin.

The composition of the instant invention can also be cured by high energy ionizing irradiation or bombardment such as is described in the aforesaid U.S. Pat. No. 4,008,341.

In an alternate preferred form of the present invention a low molecular weight liquid rubber polymer may be incorporated in the previously described compositions in order to increase the softness of relief plates made therefrom. Suitable liquid rubber polymers have molecular weights of 750 to 3000 and comprise butadiene homopolymers and copolymers containing at least 30% by copolymer weight, more preferably at least 60% by copolymer weight butadiene with the remainder being either styrene or acrylonitrile. The addition of such liquid rubber polymers should not constitute greater than 50% by weight of the total composition and preferably should constitute from 0.1–50%, more preferably 5–30% by weight of the total composition.

The composition of the present invention may in proper instances include such additives as antioxidants, inhibitors, activators, fillers, pigments, dyes, antistatic agents, viscosity modifiers, plasticizers and the like. The aforesaid additives may be present in quantities up to 500 parts or more per 100 parts radiation curable composition by weight and preferably 0.0005 to 300 parts on the same basis. The type and concentration of the additives must be selected with care so that the final composition remains suitable for its use and in preferred embodiments radiation curable under conditions of exposure.

The curing period may be retarded or accelerated from less than 1 minute to 30 days or more. Conventional curing inhibitors or retarders which may be used in order to stabilize the components or curable compositions so as to prevent premature onset of curing may include hydroquinone; p-tert-butyl catechol; 2,6-di-tert-butyl-p-methylphenol; phenothiazine; N-phenyl-2-naphthylamine; phosphorous acid; pyrogallol and the like. Conventional reaction promoters which give faster curing reaction rates and broaden the range of utilizable light wavelengths include trimethylphosphite, triethylphosphite, triphenylphosphite, rose bengal and acetone.

The method of mixing the components of the photosensitive compositions of the present invention is not critical, and does not constitute part of the invention.

Solutions and dispersions of the photopolymerizable compositions can be made with such solvents as aromatic hydrocarbons, e.g. benzene, toluene and xylene; chlorinated hydrocarbons, e.g. chloroform, carbon tetrachloride, trichloroethylene and chlorotoluene; ketones, e.g. methyl ethyl ketone, diethyl ketone and methyl isobutyl ketone and blends of such solvents. On the other hand, solid mixes may be prepared by mixing the components on a mill or in an internal mixer such as a Banbury. The resultant polymerizable compositions may be in the form of a liquid solution, liquid dispersion, or as a solid mix. The liquid solution or liquid dispersion may be cast directly upon a substrate, or first cast upon a suitable wheel or belt, stripped, and then affixed to a substrate surface. The solid mix may be extruded or calendered directly upon the substrate or as a self-supporting sheet and then affixed to the surface of the substrate.

A convenient method of forming a printing plate, which is the preferred form of the invention, is to place an image-bearing, line or halftone, stencil or positive or negative transparency parallel to the surface of the photocurable composition which is secured to a support or to a light-absorptive layer on the support. The image-bearing transparency and the surface of the photocurable composition should preferably be in contact. To make possible easy removal of the image bearing transparency from the printing plate after photopolymerization, it is desirable to coat the printing plate with a "parting" layer or slip coat. Suitable coatings include the conventional acrylic latex slip coats, silicon greases, etc. The photocurable layer is exposed through the transparency to a source of actinic light until the photocurable layer is cured to an insoluble stage in the exposed areas. The thickness of the ultimate relief in such a process may be controlled by varying the thickness of the layer of the photocurable composition, and/or the exposure time.

Development can be carried out by conventional means. In general after exposure of the plates, the unexposed areas are removed by suitable means such as a suitable solvent liquid which has good solvent action on the mono-alkenyl aromatic-diene copolymer and relatively little action on the insolubilized, photopolymerized image or upon the substrate, antihalation coating, or any anchor layer, in the period required to remove the non-polymerized portions. Suitable organic solvents include aliphatic hydrocarbons such as hexane, octane, mineral oil, naphthas, etc. aromatic solvents such as toluene, xylene, etc., halogenated organic solvents such as methylene chloride, trichloroethane, Freon$^D$, etc., and blends of such solvents. The best solvent to use depends on the exact composition of the photosensitive printing plate. In the development step where the relief is formed the solvent may be applied in any convenient manner, as by pouring, immersion, or spray. Brushing or agitation aid in the removal of the non-polymerized portion of the composition. The use of ultrasonic washing techniques is a convenient means of removing the non-polymerized areas of the relief printing plate.

The relief plate of the present invention is preferably formed in a layer of the photopolymerizable composition, typically 2 to 200 mils in thickness, adherent to a flexible backing. Layers ranging from 3 to 60 mils thickness will be used for the majority of the letterpress printing plates. Layers thicker than 50 to 60 mils can be used for the printing of designs and relatively large areas in letterpress printing plates. In general, the relief height-forming stratum of the photopolymerizable layer should be essentially non-light scattering. It is important that the final photosensitive composition possess sufficient clarity so as to permit the passage of light in sufficient quantity to effect the addition-photopolymerization.

In making printing plates it is important that the exposure be sufficient to harden the photocurable composition in the exposed image areas without causing significant curing in the non-image areas. Aside from exposure time and light intensity, the extent of the exposure is dependent on the thickness of the photocurable layer, the curing temperature, the monomer having the photo-cross-linkable C—C-double bond and polythiol employed, the photoinitiator, diluent, the presence of light absorbing pigments or dyes in the photocurable composition and the character of the image to be reproduced. In general, the thicker the layer to be cured, the longer the exposure time. Curing generally starts at the surface of the photocurable layer closest to the light source and proceeds downward to the support. With insufficient exposure, the layer may have a hard cure at the surface but, through lack of a clear-through cure, the relief will be removed when the unexposed area is removed. Inasmuch as the curing rate usually increases at higher temperature, less exposure is required thereat than at room temperature. Thus, ultraviolet light sources that emit heat are more efficient than cold ultraviolet light sources. However, care must be exercised that too high a temperature is not attained during the photocure, as this leads, in some cases, to thermal expansion of the photocurable composition which results in image distortion. Hence, it is preferred that the photocuring be carried out at a temperature in the range about 20° to about 70° C. Due to the number of variables which affect exposure time, optimum results are best determined by trial and error, e.g. stepped exposures with characterization after each exposure.

A supporting base material, i.e. the substrate, which acts as a support for the photosensitive composition in the preferred printing plate products may be practically any natural or synthetic product capable of existing in film or sheet form, which is generally dimensionally stable and flexible. It is a common practice, known to those skilled in the art, to use sheet metals such as aluminum or steel, or plastics such as polyester of polyamide film, as substrates. The preferred substrate supporting base material is a polyester film. Such materials are rendered non-reflective, where necessary, by coating with an antihalation layer. Suitable antihalation coatings may be made by dispersing in a solution or aqueous dispersion of a resin or polymer a finely divided dye or pigment which substantially absorbs actinic light. The antihalation layer may also be formulated such that it acts as a binder or adhesive layer between the substrate and photosensitive composition. Antihalation pigments include carbon black, manganese dioxide and dyes, e.g. Acid Blue Black (CI20470) and Acid Magenta 0 (CI 42685). A dyed metal plate is also useful.

In those instances where rotary press plates are desired, the support material may be used to form flat relief plates which are then formed to the desired shape. Such rotary press plates may also be prepared by using cylindrically shaped support plates of the various types carrying the curable composition and exposing them directly to actinic light through a concentrically disposed image-bearing transparency.

The invention is further illustrated by the following examples:

EXAMPLE I

A photosensitive composition consisting of the following mixture was prepared:

(a) 100 parts of styrene-isoprene-styrene (SIS) block copolymer.
(b) 15 parts of trimethylolpropane trimethacrylate.
(c) 2 parts pentaerythritol tetrakis ($\beta$-mercaptopropionate).
(d) 2 parts 2,2 dimethoxy 2-phenyl acetophenone.
(e) 2 parts hindered phenol(Ionol®)(a curing inhibitor).

The particular SIS copolymer was Kraton® 1107, manufactured by the Shell Chemical Company, and was composed of approximately 14% by weight polystyrene equally distributed between the two end blocks, the remainder being polyisoprene. The relief plate was prepared by dissolving the composition in toluene in a stirred resin kettle. Ingredient (a) was charged in first and dissolved followed by (b), (d) and (e) in rapid succession and then (c) after the others had dissolved. The solution was then cast to a thickness of approximately 80 mils on a polyester backing sheet.

The dried photosensitive layer was then coated with a standard commercial amide based slip coat to less than ¼ mil. A 10-inch by 12-inch piece of the resultant plate was placed in a vacuum frame, and the coated photopolymer surface was brought into contact with a line process negative. The element was then exposed to actinic radiation (5000 $\mu$W/cm$^2$) for 1.00 min. After exposure, the negative was stripped from the element, and the element was subjected to an etch bath containing trichloroethane to remove the unexposed polymer. A relief image corresponding to the clear areas of the negative was obtained. The photopolymerized relief plate was characterized by excellent softness, resilience, sharpness of image and essentially a tack free surface. The plate was placed on a printing cylinder, on a flexo press and excellent prints of the original image were obtained on polyester film. The relief plate also had excellent abrasion resistance, durability, and resistance to printing ink solvents as determined by visual observation.

The composition of Example I had the following properties $$\frac{100 \text{ parts (SIS)}}{121 \text{ parts-total all ingredients}} \times 100 =$$
82% by weight of the composition is monoalkenyl aromatic-diene copolymer resin $$\frac{15 \text{ parts trimethlolpropane trimethacrylate}}{100 \text{ parts (SIS)}} \times 100 =$$
15% by resin weight of monomer substantially compatible with said resin and having at least one photo-cross-linkable C-C-double bond $$\frac{2 \text{ parts pentaerythritol tetrakis } (\beta\text{-mercaptopropionate})}{100 \text{ parts (SIS)}} \times 100 =$$
by resin weight of polythiol containing at least two-SH groups per molecule $$\frac{2 \text{ parts 2,2 dimethoxy 2-phenyl acetophenone}}{100 \text{ Parts (SIS)}} \times 100 =$$
2% by resin weight of photoinitiator

EXAMPLE II

A printing plate was prepared essentially as in Example I except the composition consisted of the following mixture:

(a) 100 parts of the same SIS copolymer.
(b) 20 parts trimethylolpropane trimethacrylate.
(c) 2 parts pentaerythritol tetrakis ($\beta$-mercaptopropionate)
(d) 2 parts 2,2dimethoxy 2-phenyl acetophenone.
(e) 2 parts hindered phenol.

The results were essentially the same as those described in Example I including the printing test results.

EXAMPLE III

A printing plate was prepared essentially as in Example I except the composition consisted of the following mixtures:

(a) 100 parts of the same SIS copolymer
(b) 15 parts trimethylolpropane trimethacrylate
(c) 2 parts pentaerythritol tetrakis ($\beta$-mercaptopropionate)
(d) 4 parts benzophenone
(e) 2 parts hindered phenol.

The results were essentially the same as those described in Example I, including the printing test results.

EXAMPLE IV

A printing plate was prepared essentially as in Example I, except the composition consisted of the following mixture:

(a) 100 parts of the same SIS copolymer
(b) 15 parts trimethylolpropane triacrylate.
(c) 2 parts pentaerythritol tetrakis ($\beta$-mercaptopropionate)
(d) 2 parts 2,2 dimethoxy 2-phenyl acetophenone
(e) 2 parts hindered phenol.

The results were essentially the same as those described in Example I, including the printing test results.

EXAMPLE V

A printing plate was prepared essentially as in Example I except the composition consisted of the following mixture:

(a) 100 parts of styrene-butadiene-styrene (SBS) block copolymer (Kraton® 1102, Shell Chemical Company).
(b) 15 parts trimethylolpropane trimethacrylate
(c) 2 parts pentaerythritol tetrakis ($\beta$-mercaptopropionate)
(d) 2 parts 2,2 dimethoxy 2-phenyl acetophenone
(e) 2 parts hindered phenol.

The ingredients were not dissolved in toluene but where instead blended in an internal shear mixer and subsequent calendered onto a polyester backing.

The results were essentially the same as those described in Example I, including the printing test results.

EXAMPLE VI

A printing plate was prepared essentially as in Example I except the composition consisted of the following mixture:

(a) 100 parts of the same SIS copolymer
(b) 15 parts trimethylolpropane trimethacrylate
(c) 2 parts pentaerythritol tetrakis (β-mercaptopropionate)
(d) 2 parts 2,2 dimethoxy 2-phenyl acetophenone
(e) 2 parts hindered phenol.
(f) 15 parts liquid butadiene rubber (Arco's Poly bd CS-15)

The results were essentially the same as those described in Example I, including the printing test results.

EXAMPLES VII-XII

Controls

The procedures of Examples I–V were repeated respectively except ingredient (c), the pentaerythritol tetrakis (β-mercaptopropionate), was omitted in each Example.

The plates possessed similar properties except they had tacky surfaces to touch as tested by touching the surface with the hand. In addition the plates exhibited slower activation as is illustrated quantitatively in Table 1 which follows Example XIV.

EXAMPLE XIII

Control

A printing plate was prepared essentially as in Example I except the composition consisted of the following mixture:

(a) 100 parts of the same SIS copolymer.
(b) 10 parts trimethylolpropane trimethacrylate.
(c) None
(c) 1 part 2,2 dimethoxy 2-phenyl acetophenone.
(e) 2 parts hindered phenol.

These results were essentially the same as those of the other controls described in Examples VII-XII.

EXAMPLE XIV

A printing plate was prepared essentially as in Example I except the composition consisted of the following mixture:
(a) 100 parts of the same SIS copolymer.
(b) 10 parts trimethylolpropane trimethacrylate.
(c) 2 parts pentaerythritol tetrakis (β-mercaptopropionate)
(d) 1 part 2,2 dimethoxy 2-phenyl acetophenone.
(e) 2 parts hindered phenol.
The results were essentially the same as those described in Example I including the printing test results.

TABLE 1

| EXAMPLE | ELONGATION | TENSILE | RESILIENCE | SHORE A | ACTIVITY |
|---|---|---|---|---|---|
| XIII | 414 | 952 | 54 | 62 | 1100 |
| XIV | 500 | 728 | 59 | 60 | 800 |
| IV | 455 | 892 | 52 | 63 | 725 |

The higher the activity number the longer is the period required for adequate cure. Thus, as a general proposition, the lower the "activity" number the better the printing plate formation performance of the composition. The activity number is the minimum number of light units required to stabilize a 5%-150 line halftone dot in a photosensitive layer to form a printing plate. The photosensitive layer is exposed through a test negative containing the indicated dot and then the photosensitive layer is etched as described in the Examples except with varient light units. The units recorded are read from a light integrator which controls the number of light units used. Elongation and Tensile were determined by ASTM method D2707-72. Resilience was determined by ASTM method D2632-74 and Shore A was determined by ASTM method D2240-75.

This invention provides a simple, effective relief printing plate utilizing inexpensive materials and minimal labor requirements. The images obtained are sharp and show fidelity to the original transparency both in small details and overall dimensions. A significant advantage arises from the fact that the softness and flexibility of the photopolymerized printing plates makes possible the use of "kiss impression" printing techniques. This printing technique is preferred especially by the book publishing industry as it allows use of coarse "antique" papers, as well as higher press speeds. The abrasion resistance of the photopolymerized printing plates make the plate more durable than those presently available. An important commercial advantage is their lightness in weight. This invention also provides a composition that eliminates the use of a de-tackifying treatment in the plate making process.

While in accordance with the patent statutes, we have described what at present is considered to be the preferred embodiment of our invention, it will be obvious to those skilled in the art that numerous changes and modifications may be made therein without departing from the invention and it is therefore aimed in the appended claims to cover all such equivalent variations as fall within the true spirit and scope of the invention.

What we claim is:

1. The method of forming a printing plate which comprises exposing to actinic radiation projected through an image-bearing transparency selected portions of a radiation curable composition comprising
   (1) at least about 20% by weight of said composition of monoalkenyl aromatic-diene copolymer resin;
   (2) at least about 2% by resin weight of at least one monomer substantially compatible with said resin and having at least one photo-cross-linkable C—C-double bond;
   (3) about 0.1 to about 35% by resin weight of polythiol containing at least two-SH groups per molecule and
   (4) about 0.01 to about 10% by resin weight of photoinitiator.

2. The method of claim 1 wherein said resin (1) is present in an amount of at least 40% by composition weight and is a block copolymer having the general formula A-B-A with blocks A being monoalkenyl aromatic blocks with may be the same or different and which have an average molecular weight of from 2,000 to 100,000 and a glass transition temperature above 25° C. and having the general formula:

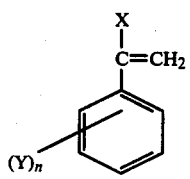

wherein X represents hydrogen or an alkyl radical containing 1 or 2 carbon atoms, Y represents hydrogen or an alkyl radical containing from 1 to 4 carbon atoms, and n represents an integer from 1 to 5 and with block B being derived from conjugated diene hydrocarbon having the general formula:

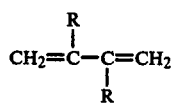

wherein each R individually represents hydrogen or an alkyl radical containing 1 to 2 carbon atoms.

3. The method of claim 2 wherein said monomer (2) is an addition photopolymerizable polyethylenically unsaturated acrylic or methacrylic acid ester containing two or more acrylate or methacrylate groups per molecule or mixtures thereof and is present in an amount of at least 10% by resin weight.

4. The method of claim 2 wherein said polythiol (3) is chosen from the group consisting of pentaerythritol tetrakis (β-mercaptopropionate) and trimethylolpropane tris (β-mercaptopropionate) and mixtures thereof and is present in an amount of 0.5 to 10% by resin weight.

5. The method of claim 2 wherein from about 0.1 to about 50% by resin weight of a liquid polymer that is a homopolymer of butadiene or a copolymer of at least 30% by weight butadiene with the remainder being either styrene or acrylonitrile is included in said radiation curable composition.

6. The method of claim 3 wherein said monomer (2) is present in an amount of 15-30% by resin weight, said photoinitiator (4) is chosen from the group consisting of benzophenone and 2,2 dimethoxy 2-phenyl acetophenone and mixtures thereof and is present in an amount of 0.2 to 5%, and said radiation curable composition is applied to a substrate of polyester film in a coating thickness of about 2 to about 200 mils.

7. The method of claim 1 wherein said resin (1) is present in an amount of at least 40% by composition weight and is a two block copolymer of 30-95% by weight diene-hydrocarbon with 4 to 5 C-atoms and 5 to 70% by weight of a monomer of formula

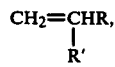

whereby R=H or CH₃, R'=phenyl or C₁-C₄ alkyl-substituted phenyl.

8. The method of claim 7 wherein said monomer (2) is an addition photopolymerizable polyethylenically unsaturated acrylic or methacrylic acid ester containing two or more acrylate or methacrylate groups per molecule or mixtures thereof and is present in an amount of at least 10% by resin weight, said polythiol (3) is chosen from the group consisting of pentaerythritol tetrakis (β-mercaptopropionate) and trimethylolpropane tris (β-mercaptopropionate) and mixtures thereof and is present in an amount of 0.5 to 10%, said photoinitiator (4) is chosen from the group consisting of benzophenone and 2,2-dimethoxy 2-phenyl acetophenone, and said radiation curable composition is applied to a substrate of polyester film in a coating thickness of 2-200 mils.

9. The method of forming a coating on a substrate comprising applying to the surface a layer of a composition comprising
(1) at least about 20% by weight of said composition of monoalkenyl aromatic-diene copolymer resin;
(2) at least about 2% by resin weight of at least one monomer substantially compatible with said resin and having at least one radiation-cross-linkable C—C-double bond; and
(3) about 0.1 to 35% by resin weight of polythiol containing at least two-SH groups per molecule;
and thereafter exposing the layer to actinic radiation and curing said composition.

10. The method of claim 9 wherein said resin (1) is present in an amount of at least 40% by composition weight and is a block copolymer having the general formula A-B-A with blocks A being monoalkenyl aromatic blocks which may be the same or different and which have an average molecular weight of from 2,000 to 100,000 and a glass transition temperature above 25° C. and having the general formula:

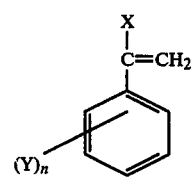

wherein X represents hydrogen or an alkyl radical containing 1 or 2 carbon atoms, Y represents hydrogen or an alkyl radical containing from 1 to 4 carbon atoms, and n represents an integer from 1 to 5; and with block B being derived from conjugated diene hydrocarbon having the general formula:

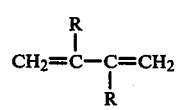

wherein each R individually represent hydrogen or an alkyl radical containing 1 or 2 carbon atoms.

11. The method of claim 10 wherein said monomer (2) is an addition photopolymerizable polyethylenically unsaturated acrylic or methacrylic acid ester containing two or more acrylate or methacrylate groups per molecule or mixtures thereof and is present in an amount of at least 10% by resin weight and said polythiol (3) is chosen from the group consisting of pentaerythritol tetrakis (β-mercaptopropionate) and trimethylolpropane tris (β-mercaptopropionate) and mixtures thereof and is present in an amount of 0.5 to 10% by resin weight.

12. The method of claim 10 wherein said composition includes from about 0.01 to about 10% by resin weight of photoinitiator.

13. The method of claim 9 wherein said resin (1) is present in an amount of at least 40% by composition weight and is a two block copolymer of 30-95% by weight diene-hydrocarbon with 4 to 5 C-atoms and 5 to 70% by weight of a monomer having the general formula $$CH_2=CHR,$$
$$\underset{R'}{|}$$

whereby R=H or $CH_3$ and R'=phenyl or $C_1$-$C_4$ alkyl-substituted phenyl.

14. The method of claim 13 wherein said composition includes from about 0.01 to about 10% by resin weight of photoinitiator.

* * * * *